(12) United States Patent
Blednov et al.

(10) Patent No.: US 7,920,029 B2
(45) Date of Patent: Apr. 5, 2011

(54) POWER AMPLIFIER

(75) Inventors: Igor Blednov, Nijmegen (NL); Radjindrepersad Gajadharsing, Beuningen (NL)

(73) Assignee: NXP B.V., Eindhoven (NL)

( * ) Notice: Subject to any disclaimer, the term of this patent is extended or adjusted under 35 U.S.C. 154(b) by 287 days.

(21) Appl. No.: 12/278,836

(22) PCT Filed: Feb. 6, 2007

(86) PCT No.: PCT/IB2007/050391
§ 371 (c)(1),
(2), (4) Date: Aug. 8, 2008

(87) PCT Pub. No.: WO2007/091212
PCT Pub. Date: Aug. 16, 2007

(65) Prior Publication Data
US 2010/0164632 A1 Jul. 1, 2010

(30) Foreign Application Priority Data
Feb. 10, 2006 (EP) .................................... 06101513

(51) Int. Cl.
*H03F 3/04* (2006.01)
(52) U.S. Cl. .................. 330/310; 330/251; 330/297
(58) Field of Classification Search .................. 330/310, 330/251, 297
See application file for complete search history.

(56) References Cited

U.S. PATENT DOCUMENTS

| | | | |
|---|---|---|---|
| 6,256,482 B1 | 7/2001 | Raab | |
| 7,092,691 B2 * | 8/2006 | Bohn et al. | 455/280 |
| 7,193,472 B2 * | 3/2007 | Gotou et al. | 330/295 |
| 7,391,259 B2 * | 6/2008 | Parker et al. | 330/84 |
| 7,663,435 B2 * | 2/2010 | Kim et al. | 330/124 R |
| 2002/0101284 A1 | 8/2002 | Kee et al. | |
| 2004/0056723 A1 | 3/2004 | Gotou | |
| 2005/0215209 A1 | 9/2005 | Tanabe et al. | |

FOREIGN PATENT DOCUMENTS

| | | |
|---|---|---|
| EP | 0757434 A | 2/1997 |
| EP | 1492229 A | 12/2004 |
| EP | 1598943 A1 | 11/2005 |
| FR | 2683686 A | 5/1993 |
| WO | 0110013 A1 | 2/2001 |
| WO | 02073794 A | 9/2002 |

* cited by examiner

*Primary Examiner* — Patricia Nguyen

(57) ABSTRACT

A radio frequency power amplifier has first and second amplifier stages coupled in series, one of which is operated in class F and the other is operated in inverse class F; an envelope detector adapted to detect an envelope of the input signal; a power supply coupled to supply an electrical supply voltage to the first and second amplifier stages, wherein the electrical supply voltage is controlled to follow the envelope of the input signal. Such amplifier makes it possible to maintain class F and inverse class F operation, respectively, of the first and second amplifier stages independent on the input signal. Preferably, this is done by controlling the electrical supply voltage so that the saturation levels of the first and second amplifier stages follow the envelope of the input signal.

15 Claims, 4 Drawing Sheets

POWER AMPLIFIER

The invention relates to radio frequency power amplifiers using class F and inverse class F amplifier stages coupled in series, one of which is operated in class F and the other is operated in inverse class F.

Such radio frequency power amplifiers are often used because of their high power efficiency. Class F operation implies operating the amplifier stages as switching amplifiers, where the amplifier stages and/or its components are driven near or into saturation. This produces harmonic distortion of the carrier wave and of the information-carrying side bands. This harmonic distortion can be removed by filters, which are also referred to as harmonic traps.

Class F boosts both efficiency and output by using harmonic resonators in the output network to shape the drain waveforms. The voltage waveform includes one or more odd harmonics and approximates a square wave, while the current includes even harmonics and approximates a half sine wave. Alternately, as in inverse class F, the voltage can approximate a half sine wave and the current a square wave. As the number of harmonics increases, the efficiency of an ideal power amplifier increases from the 50 percent (class A) toward unity (class D) and the utilization factor increases from $1/8$ (class A) toward $1/2\pi$ (class D). The required harmonics can in principle be produced by current source operation of the transistor. However, in practice the transistor is driven into saturation during part of the RF cycle and the harmonics are produced by a self-regulating mechanism similar to that of saturating class C. Use of a harmonic voltage requires creating a high impedance (in practice typically about 3 to 10 times the load impedance) at the drain, while use of a harmonic current requires a low impedance (in practice typically about $1/3$ to $1/10$ of the load impedance). While class F requires a more complex output filter than other power amplifiers, the impedances must be correct at only a few specific frequencies. Lumped-element traps are used at lower frequencies and transmission lines are used at microwave frequencies. Typically, a shorting stub is placed a quarter or half-wavelength away from the drain. Since the stubs for different harmonics interact and the open or short must be created at a "virtual drain" ahead of the drain capacitance and bond-wire inductance, implementation of suitable networks is a bit of an art. Nonetheless, class F power amplifiers are successfully implemented from MF through Ka band.

A variety of modes of operation between classes C, E, and F are possible. The maximum achievable efficiency depends upon the number of harmonics, (0.5, 0.707, 0.8165, 0.8656, and 0.9045 for 1 through 5 harmonics, respectively). The utilization factor depends upon the harmonic impedances and is highest for ideal class F operation.

Class F operation is specified in terms of harmonic impedances, so it is relatively easy to see how transmission-line networks are used. The required impedances must be produced at a virtual ideal drain that is separated from the output network by a set of parasitic elements such as drain capacitance, bond-wire/lead inductance. Typically, a transmission line between the drain and the load provides the fundamental-frequency drain impedance of the desired value. A stub that is a quarter wavelength at the harmonic of interest and open at one end provides a short circuit at the opposite end. The stub is placed along the main transmission line at either a quarter or a half wavelength from the drain to create either an open or a short circuit at the drain. The supply voltage is fed to the drain through a half-wavelength line bypassed on the power-supply end or alternately by a lumped-element choke. When multiple stubs are used, the stub for the highest controlled harmonic is placed nearest the drain. Stubs for lower harmonics are placed progressively further away and their lengths and impedances are adjusted to allow for interactions. "Open" means relatively high impedance, typically three to ten times the fundamental-frequency impedance, and "shorted" means relatively low impedance, typically no more $1/10$ to $1/3$ of the fundamental-frequency impedance.

Class F amplifiers are usually considered as very high efficiency RF amplifiers where the high efficiency is obtained through the use of harmonic traps (L-C filters or quarter-wavelength transmission lines) to provide suitable terminations (either open or short) for the harmonics generated by the non-linear operation. Idealized, a square wave drain voltage and a peaked half-sinusoidal drain current out-of-phase by 180 degrees relative to the drain voltage are hereby produced. In such ideal case, since only a drain voltage or a drain current exists at any given time, the power dissipation in the amplifier is zero resulting theoretically in 100% efficiency. In practice the efficiency is lower. These very high efficiency values usually result in poor linearity.

On the other hand, linear power amplifiers result in low distortion but have relatively low energy efficiency. Poor energy efficiency directly affects operating costs and causes thermal heating issues in base station transmitters and reduces battery life in mobile station transmitters. Thus the power amplifier designer is forced to a trade-off between linearity and efficiency.

A disadvantage of inverse class F operation is the narrow dynamic range close to saturation at certain level of non-linearity, where high efficiency operation can be maintained. In case of amplifier stages using voltage controlled elements such as field effect transistors, e.g. GaAs FET and LDMOST devices, the ideal input signal is a rectangular voltage wave, while current controlled devices, like bipolar junction transistors (BJTs), require a rectangular input current to produce the required rectangular output current waveform for inverse class F.

A major problem in implementing inverse class F operation over a wide dynamic range of input signals consists in keeping the required shape of input signal voltage/current wave independent of power level. Presence of the desired harmonics of the RF carrier wave in the input signal is vital for obtaining high efficiency and desired output voltage waveforms.

The invention solves this problem by providing a radio frequency power amplifier with an input for receiving a radio frequency input signal; first and second amplifier stages coupled in series, one of which is operated in class F and the other is operated in inverse class F; an envelope detector adapted to detect an envelope of the input signal; a power supply coupled to supply an electrical supply voltage to the first and second amplifier stages, wherein the electrical supply voltage is controlled to follow the envelope of the input signal.

Such a radio frequency power amplifier makes it possible to maintain class F and inverse class F operation, respectively, of the first and second amplifier stages independent on the input signal. Preferably, this is done by controlling the electrical supply voltage so that the saturation levels of the first and second amplifier stages follow the envelope of the input signal.

The invention will be described in connection with the figures, which represent:

Figure 1:
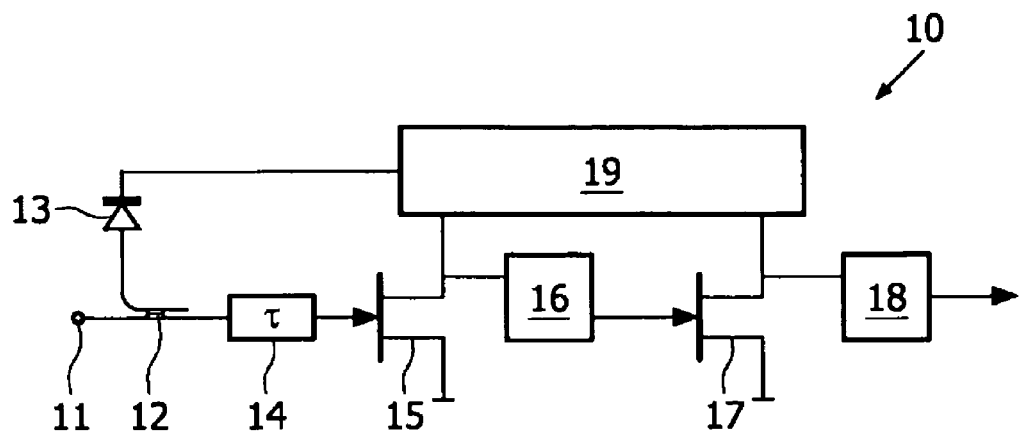
FIG. 1 shows schematically an embodiment of the invention.
Figure 3:
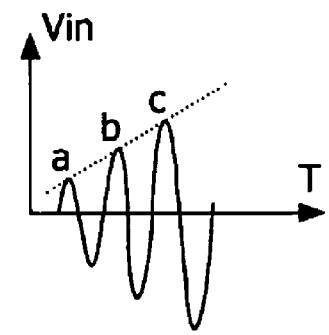
Figure 4:
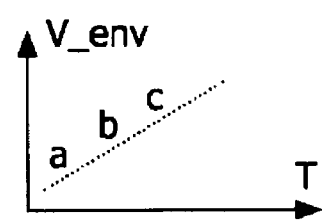
Figure 5:
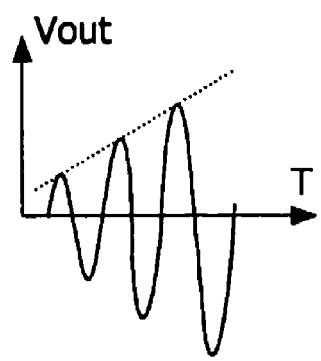
Figure 6:
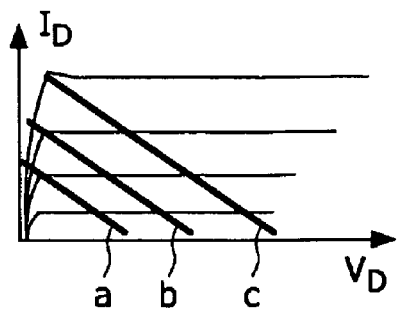
Figure 7:
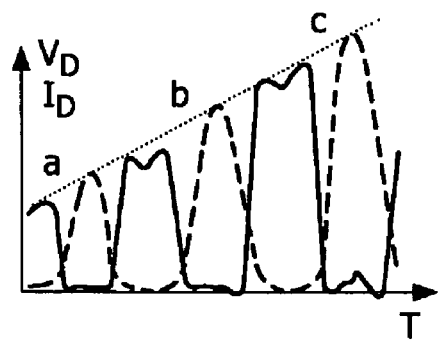
Figure 8:
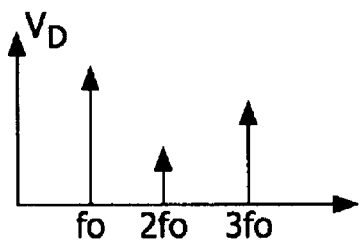
Figure 9:
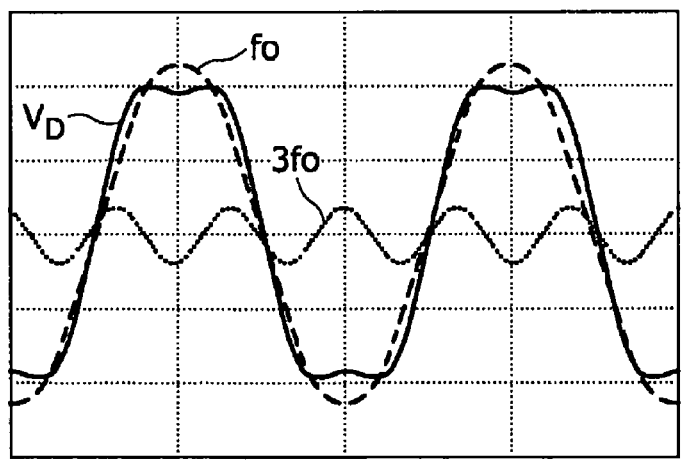
Figure 10:
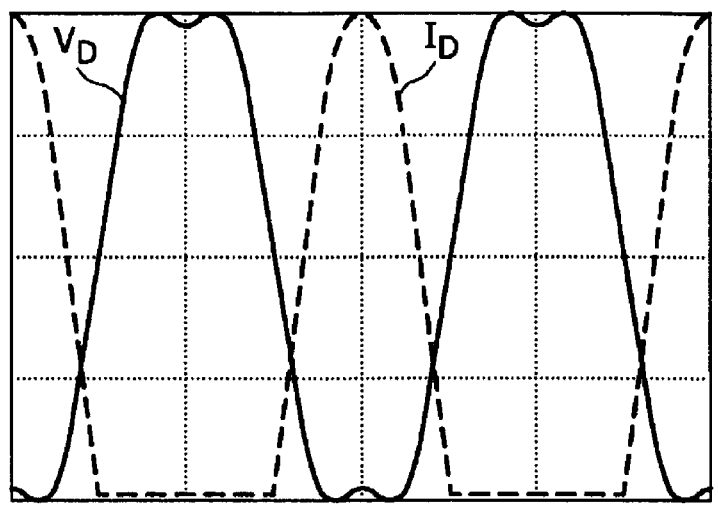
Figure 11:
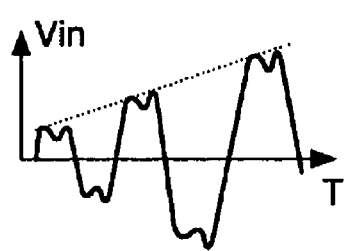
Figure 12:
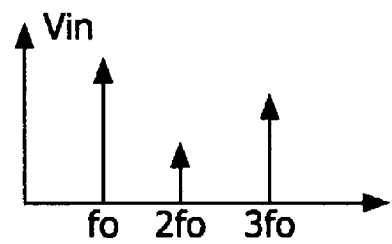
Figure 13:
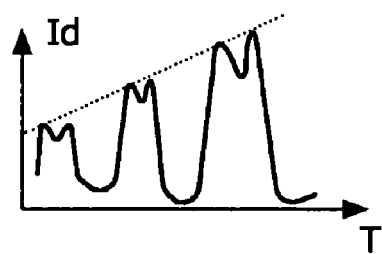
Figure 14:
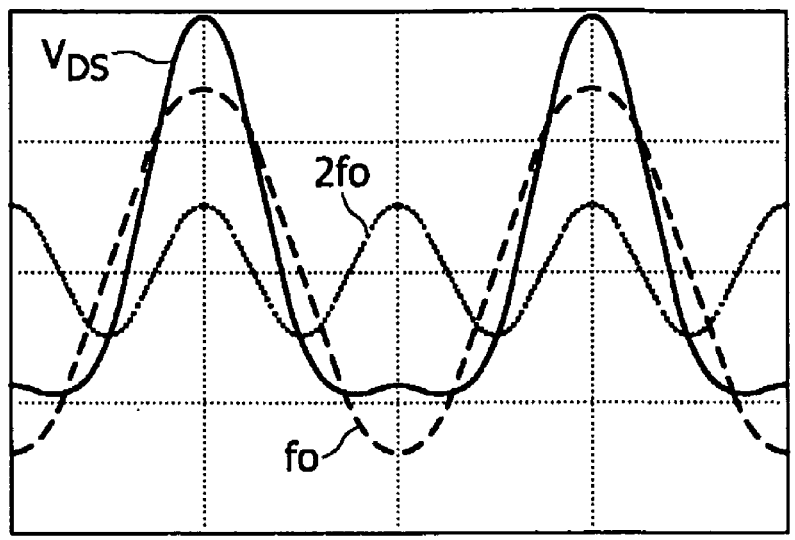
Figure 15:
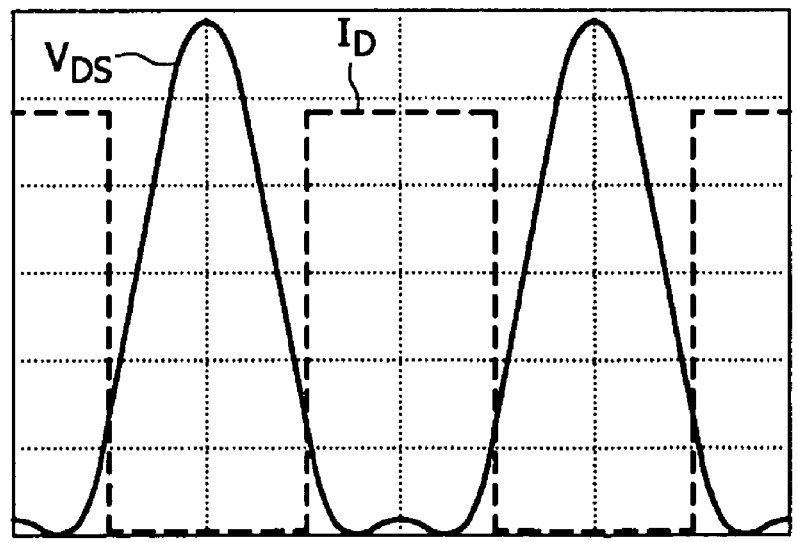

FIG. 3 shows a radio frequency carrier wave input signal with increasing amplitude, FIG. 4 shows the envelope of the carrier wave signal in FIG. 3, FIG. 5 shows the output signal of the Power amplifier in FIG. 1, FIG. 6 is a diagram showing the load lines of the first amplifier stage in FIG. 1 for the input signal in FIG. 3, FIG. 7 shows the output voltage and output current of the first amplifier stage, which is operated in class F, in FIG. 1 for the input signal in FIG. 3, FIG. 8 shows the frequency spectrum of the output voltage in FIG. 7, FIG. 9 shows the output voltage waveform and the fundamental and the third harmonic of the first amplifier stage, FIG. 10 shows the output voltage and the current through the first amplifier stage, FIG. 11 shows the input voltage to the second amplifier stage, FIG. 12 shows the frequency spectrum of the input voltage to the second amplifier stage, FIG. 13 shows the output waveform of the second amplifier stage, FIG. 14 shows the output voltage waveform and the fundamental and the second harmonic of the second amplifier stage, and FIG. 15 shows the output voltage and the current through the second amplifier stage.

The radio frequency (RF) power amplifier 10 in FIG. 1 has an input 11 for receiving a radio frequency input signal such as an amplitude modulated signal with a carrier frequency $f_o$. An RF coupler 12 senses the input signal and feeds a signal proportional to the input signal to an envelope detector 13. The envelope detector 13 detects the envelope of the input signal. The input signal is fed through a delay line 14 to a first amplifier stage 15. The output of the first amplifier stage 15—illustrated as the drain voltage—is fed to a class F interstage harmonic matching filter 16, whose output is fed to a second amplifier stage 17. Each of the first and second amplifier stages is illustrated as a single field effect transistor, although both will usually be more complex than illustrated. The output of the second amplifier stage 15, which is also illustrated as the drain voltage, is fed to an inverse class F output harmonic matching filter 18. The output of the inverse class F output harmonic matching filter 18 is taken as the output of the power amplifier 10 and can be fed e.g. to a transmitting antenna. The first and second amplifier stages 15, 17 receive a supply voltage from a power supply 19, which is coupled to the envelope detector 13 to receive the detected envelope of the input signal.

Figure 2:
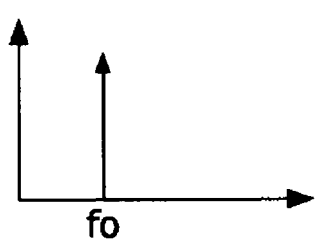
FIG. 2 shows the frequency spectrum of a radio frequency carrier wave signal.

The radio frequency power amplifier 10 in FIG. 1 is for receiving and amplifying an amplitude modulated RF signal. In FIG. 2 is illustrated the frequency spectrum of an RF signal with carrier wave frequency $f_o$, and in FIG. 3 is illustrated an example of how the amplitude of the RF carrier signal is varying. For illustrative purposes the amplitude is shown as increasing from a through b to c. FIG. 4 illustrates the detected envelope signal $V_{env}$, which is fed to the power supply 19. The power supply 19 supplies a supply voltage to the first and second amplifier stages 15, 17 which follows the envelope of the input signal.

The first amplifier stage 15 is a driver stage that is operated in class F, which implies that it acts like a switch which is driven either in its "off" state or in saturation, which is its "on" state. By controlling the supply voltage to the first amplifier stage 15 to follow the envelope of the input signal it is obtained that operation in class F can be maintained at any time independent on the instantaneous amplitude of the input signal. In FIG. 6 is illustrated three load lines a, b and c corresponding to the levels a, b and c of the envelope signal in FIG. 4, and in FIG. 7 is illustrated the corresponding output voltage $V_D$ and output current $I_D$ of the first amplifier stage. In the output voltage $V_D$ from the first amplifier stage 15 the fundamental frequency $f_o$ and the third harmonic frequency $3f_o$ are dominating, whereby the output voltage $V_D$ approximates a square wave.

The output voltage $V_D$ from the first amplifier stage 15 is fed to the class F interstage harmonic matching filter 16, which ideally is a short circuit (a low impedance) for the even harmonics of the carrier frequency $f_o$ and an open circuit (a high impedance) for the odd harmonics of the carrier frequency $f_o$. In practice the class F interstage harmonic matching filter 16 will be designed only to treat a limited number of lower harmonics such as the second and third harmonics $2f_o$ and $3f_o$. The interstage harmonic matching filter 16 also acts as an impedance transformer for $f_o$. It can be a lumped element or distributed transmission line impedance transformer providing a constant group delay in the frequency band of interest including the fundamental frequency $f_o$ and all higher harmonics used for providing the approximately square voltage waveform created at its output. It also provides conditions for Class F operation of the first amplifier stage 15 by peaking all even current harmonics, $2f_o$, $4f_o$ etc., and peaking of all odd voltage harmonics of fundamental signal, $3f_o$, $5f_o$ etc.

The second amplifier stage 17 is a power output stage that is operated in inverse class F. The approximately square wave signal from the class F interstage harmonic matching filter 16 is used as input for the second amplifier stage 17. This signal is illustrated in FIGS. 11 and 12, where the content of harmonics is illustrated. The output signal from the second amplifier stage 17, which is illustrated in FIGS. 13, 14 and 15, is filtered in the inverse class F output harmonic matching filter 18, which ideally is an open circuit (a high impedance) for all even harmonics of the fundamental frequency $f_o$ and a short circuit (a low impedance) for all odd harmonics of the fundamental frequency $f_o$. Here too, only a limited number of lower harmonics are treated such as the second and third harmonics $2f_o$ and $3f_o$. The harmonic matching filter 18 is an output impedance transformer that provides conditions for inverse Class F operation of the second amplifier stage 17 by peaking of all even voltage harmonics, $2f_o$, $4f_o$ etc., and peaking of all even current harmonics of fundamental signal, $3f_o$, $5f_o$ etc.

The resulting output signal is a replica of the input signal as illustrated in FIG. 5, and the amplifier of the invention provides an enlarged dynamic range.

The invention claimed is:

1. A radio frequency power amplifier comprising
   an input for receiving a radio frequency input signal,
   first and second amplifier stages coupled in series, one of which being operated in class F and the other being operated in inverse class F,
   an envelope detector adapted to detect an envelope of the input signal,
   a power supply coupled to supply an electrical supply voltage to the first and second amplifier stages, the electrical supply voltage being controlled for following the envelope of the input signal.

2. A radio frequency power amplifier according to claim 1 wherein the electrical supply voltage is controlled for following the envelope of the input signal for maintaining class F and inverse class F operation of the first and second amplifier stages, respectively.

3. A radio frequency power amplifier according to claim 1 wherein the electrical supply voltage is controlled so that the saturation levels of the first and second amplifier stages follow the envelope of the input signal.

4. A radio frequency power amplifier according to claim 1 wherein the first amplifier stage is operated in class F, and the second amplifier stage is operated in inverse class F.

5. A method of operating radio frequency power amplifier having an input for receiving a radio frequency input signal, first and second amplifier stages coupled in series, one of which is operated in class F and the other is operated in inverse class F, and a power supply coupled to supply an electrical supply voltage to the first and second amplifier stages the method comprising detecting an envelope of the input signal, and controlling the supply voltage to follow the envelope of the input signal.

6. A method according to claim 5 wherein the electrical supply voltage is controlled to follow the envelope of the input signal so as to maintain class F and inverse class F operation, respectively, of the first and second amplifier stages.

7. A method according to claim 5 wherein the electrical supply voltage is controlled so that the saturation levels of the first and second amplifier stages follow the envelope of the input signal.

8. A method according to claim 5 wherein the first amplifier stage is operated in class F, and the second amplifier stage is operated in inverse class F.

9. The radio frequency power amplifier according to claim 1, further including an F-class inter-stage harmonic matching filter between the first and second amplifier stages.

10. The radio frequency power amplifier according to claim 9, wherein the F-class inter-stage harmonic matching filter is configured to peak all even current harmonics and all odd voltage harmonics of a signal received from the first amplifier stage.

11. The radio frequency power amplifier according to claim 9, wherein the F-class inter-stage harmonic matching filter is configured to transform a signal received from the first amplifier stage into a square wave signal.

12. The radio frequency power amplifier according to claim 9, further including an inverse F-class output harmonic matching filter coupled to an output of the second amplifier stage.

13. The radio frequency power amplifier according to claim 1, further including an envelope detector having an input coupled to the input for receiving a radio frequency input signal and having an output coupled to a control input of the power supply.

14. The radio frequency power amplifier according to claim 13, wherein the input of the envelop detector is coupled to the input for receiving a radio frequency input signal via an RF coupler.

15. The radio frequency power amplifier according to claim 1, wherein an input of the first amplifier stage is coupled to the input for receiving a radio frequency input signal via a delay line.

* * * * *